United States Patent
Nitta

(10) Patent No.: US 6,617,930 B2
(45) Date of Patent: Sep. 9, 2003

(54) POWER SUPPLY CIRCUIT FOR TRANSMITTER

(75) Inventor: Hitoshi Nitta, Yao (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/908,626

(22) Filed: Jul. 20, 2001

(65) Prior Publication Data

US 2002/0024388 A1 Feb. 28, 2002

(30) Foreign Application Priority Data

Aug. 25, 2000 (JP) ........................................ 2000-255262

(51) Int. Cl.[7] .............................. H03F 3/04; H03G 3/00; G05F 3/16
(52) U.S. Cl. ........................ 330/297; 330/127; 323/314
(58) Field of Search ................. 330/127, 297; 323/314

(56) References Cited

U.S. PATENT DOCUMENTS

| | | | | |
|---|---|---|---|---|
| 3,900,823 A | * | 8/1975 | Sokal et al. | 330/129 |
| 4,287,599 A | * | 9/1981 | Goncharoff et al. | 307/112 |
| 5,661,643 A | * | 8/1997 | Blakely et al. | 363/21.16 |
| 5,691,631 A | * | 11/1997 | Shimamori et al. | 323/222 |
| 5,836,943 A | * | 11/1998 | Miller, III | 606/34 |
| 6,166,598 A | * | 12/2000 | Schlueter | 330/127 |
| 6,388,431 B1 | * | 5/2002 | Kramer et al. | 323/266 |

* cited by examiner

*Primary Examiner*—Patricia T. Nguyen
(74) *Attorney, Agent, or Firm*—Nixon & Vanderhye P.C.

(57) ABSTRACT

A DC voltage input to an IF, DC input is applied to a switching regulator of a power supply circuit, a DC voltage necessary for driving a power amplifier is directly applied from the switching regulator to the power amplifier, the voltage from the switching regulator circuit is applied to a voltage converter circuit from which a negative voltage of 5V is generated and applied to the power amplifier and other circuit, a positive voltage of 5V is generated from a dropper regulator circuit and applied to the power amplifier and other circuits.

11 Claims, 7 Drawing Sheets

POWER SUPPLY CIRCUIT FOR TRANSMITTER

BACKGROUND OF THE INVENTION

1. Field of the Invention

The present invention relates to a power supply circuit for a transmitter. More specifically, the present invention relates to a power supply circuit for a transmitter used in a communicating instrument used for bi-directional microwave communication-from general households or small-scale offices to broadcast satellites or communication satellites.

2. Description of the Background Art

The market for radio communication utilizing microwaves has been recently developed dramatically, along with developments of various systems including broadcast satellites and communication satellites. At the same time, the Internet has been developed and digital BS broadcast has started, ever increasing the demand for bi-directional communication.

For bi-directional communication between a small-scale office or a general home and a broadcasting station, a broadcast satellite or a communication satellite is used. Currently, it is a dominant practice to use the satellite broadcast, as a signal transmission path for a down signal (downstream) from the broadcasting station to a general home, and to use a telephone line, as a signal transmission path for an up signal (upstream) from a general home to the broadcasting station.

The telephone line used for the upstream supports only a slow rate of communication, and therefore it is not suitable for exchanging motion picture, for example, hindering promotion of satellite multimedia applications. Thus, attempts have been made to enable bi-directional communication by introducing satellite communication to the upstream transmission as well.

FIG. 5 shows a concept of bi-directional communication between each home and the broadcasting station through satellite broadcast. Referring to FIG. 5, a parabola antenna 51 is provided on the roof, for example, of a broadcasting station 50, and parabola antennas 62 and 63 are provided on the roofs of homes 60 and 61, respectively. Through broadcasting satellite 70, microwave bi-directional communication is performed between each of the parabola antennas 62 and 63 of respective homes and parabola antenna 51 of broadcasting station 50. For bi-directional communication, microwave of 12 GHz band is used for one direction and microwave of 14 GHz band is used for the other direction. An LNB (Low Noise Block down Converter) similar to the one used in the conventional system for satellite broadcast reception is used as a receiver for bi-directional communication, and a transmitter is newly provided.

FIG. 6 is a block diagram showing a main portion of such a transmitter. The transmitter is positioned close to an outdoor parabola antenna of a home. An indoor unit, not shown, is provided in the house, and a signal for an image input through a terminal such as personal computer is converted to an intermediate frequency signal of 1 GHz, for example, superposed on a DC voltage of 12V, for example, by means of a coaxial cable, and transmitted to the transmitter.

In the transmitter shown in FIG. 6, an input intermediate frequency signal is applied to an IF circuit 1 through a capacitor C3. Capacitor C3 prevents the DC voltage from being input to IF circuit 1. IF circuit 1 amplifies the intermediate frequency signal to obtain a prescribed gain, and applies the result to an RF circuit 3. RF circuit 3 mixes the intermediate frequency signal and a local oscillation signal from a local oscillation circuit 4, so as to convert to a microwave having higher frequency than the intermediate frequency signal. The microwave signal obtained by conversion is further amplified to an appropriate level, input to a power amplifier 5 to be amplified to a high power signal, and thereafter, transmitted.

The input DC voltage is supplied through a coil L1 to a power supply circuit 2. Power supply circuit 2 includes a switching regulator circuit 6, dropper regulator circuits 7 and 8, and a voltage converter circuit 9. Switching regulator circuit 6 converts the input DC voltage of 13V to 26V to a positive DC voltage of 12V, for example. The positive DC voltage output from switching regulator circuit 6 is applied to dropper regulator circuits 7 and 8 as well as to voltage converter circuit 9.

Dropper regulator circuit 7 converts the positive DC voltage of 12V from switching regulator circuit 6 to a voltage value appropriate for voltage supplied to power amplifier 5, for example, 10V, and supplies the resulting voltage to power amplifier 5. Dropper regulator circuit 6 converts the voltage from switching regulator 6 to a positive voltage appropriate for voltage supplied to IF circuit 1, RF circuit 3 and local oscillation circuit 4, for example, 5V, and supplies the resulting voltage to respective circuits. Voltage converter circuit 9 converts the positive DC voltage input from switching regulator circuit 6 to a negative voltage of −5V, for example, and supplies the same to RF circuit 3.

In power supply circuit 2, dropper regulator circuits 7 and 8 are constant voltage circuits converting the positive, 12V DC voltage to +10V and +5V, respectively, for example, while voltage converter circuit 9 converts +12V to −5V.

FIGS. 7 and 8 illustrate an operation of the voltage converter 9 shown in FIG. 6. Voltage converter circuit 9 includes an oscillation circuit 91, a frequency dividing circuit 92, a level converting circuit 93 and a negative voltage generating circuit 94. Oscillation output of oscillation circuit 91 is divided into two by frequency dividing circuit 92, for example, and the voltage level is converted by level converting circuit 93 from 12V to 5V. By the negative voltage generating circuit 94, −5V is generated. In negative voltage generating circuit 94, first, switches SW2 and SW4 are turned off as shown in FIG. 7 and thereafter, switches SW1 and SW3 are turned on. In this state, the input voltage V+ is charged to capacitor C1 through the path of V+→SW1→C1→SW3→GND.

After the end of the charge cycle, a pump cycle starts, in which switches SW1 and SW3 are turned off as shown in FIG. 8, and thereafter, switches SW2 and SW4 are turned on. In this state, charges that have been stored in capacitor C1 are shifted to capacitor C2 for charging, by the closed loop of C1→SW2→C2→SW4.

After the pump cycle, the operation goes to the first charge cycle, and the above described operations are repeated. Assuming that the resistance RL is infinite in the initial state, Vout is at the potential of −V with respect to GND level, when Vout to GND are viewed. Namely, −5V is output at the Vout terminal.

As shown in FIGS. 7 and 8, voltage converter 9 converts a positive (+) potential to a negative (−) potential by the charging/discharging of charges to and from capacitors C1 and C2. Therefore, when there is a large current flowing to the load, the output potential lowers. Therefore, it is necessary to provide a DC voltage higher in absolute value than the output voltage −5V, and therefore, it is necessary for switching regulator circuit 6 to provide the voltage of +12V to voltage converter circuit 9.

However, a voltage of +12V is output from switching regulator circuit 6, which is lowered to +10V by dropper regulator circuit 7, and in addition, a large current flows through power amplifier 5. Therefore, power loss experienced in dropper regulator circuit 7 is wasted. Further, as the current flowing through power amplifier 5 itself is large, there is also a considerable power loss at this portion, increasing power consumption of the overall transmitter. Increase in power consumption requires an expensive power source of the indoor unit that feeds to the DC voltage input and intermediate frequency signals, resulting in increased cost. This partially hinders introduction of the satellite bi-directional communication instruments to general household. Further, increase in power consumption is against the current environmental movement.

SUMMARY OF THE INVENTION

Therefore, an object of the present invention is to provide a power supply circuit for a transmitter that can reduce power consumption of the transmitter and reduce overall cost including the cost of the indoor unit.

Briefly stated, the present invention provides a transmitter converting an intermediate frequency signal superposed on a DC voltage to a microwave signal and providing the same, which includes a switching regulator circuit converting an input DC voltage to a constant DC voltage, and a power amplifier for amplifying the microwave signal, wherein the output DC voltage from the switching regulator circuit is supplied directly to the power amplifier without any intervening regulator.

Therefore, according to the present invention, the loss corresponding to the voltage drop experienced in the conventional dropper regulator can be eliminated, so that power consumption of the overall transmitter can be reduced and the cost can be reduced.

In a preferred embodiment, the switching regulator circuit includes a circuit for variably changing the output voltage.

In a more preferred embodiment, the circuit includes a switching element connected between the switching regulator circuit and the power amplifier for turning on/off the supply of the DC voltage.

In a more preferred embodiment, the circuit includes a circuit for converting a positive voltage to a negative voltage, and the switching element turns on/off the DC voltage to be supplied to the power amplifier dependent on presence/absence of the output voltage from the circuit.

In a more preferred embodiment, the circuit for converting the positive voltage to the negative voltage is a DC-DC converter.

Further, in a more preferred embodiment, the DC voltage output from the switching regulator circuit is delayed, and in accordance with the delayed output signal, the switching element is turned on to supply the DC voltage from the switching regulator to the power amplifier.

Further, in a more preferred embodiment, the power amplifier is driven with a low voltage.

Further, in a more preferred embodiment, the circuit includes a dropper regulator for converting the output voltage of the switching regulator to a voltage for driving other circuit.

Further, in a more preferred embodiment, the dropper regulator is a low input/output voltage regulator.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
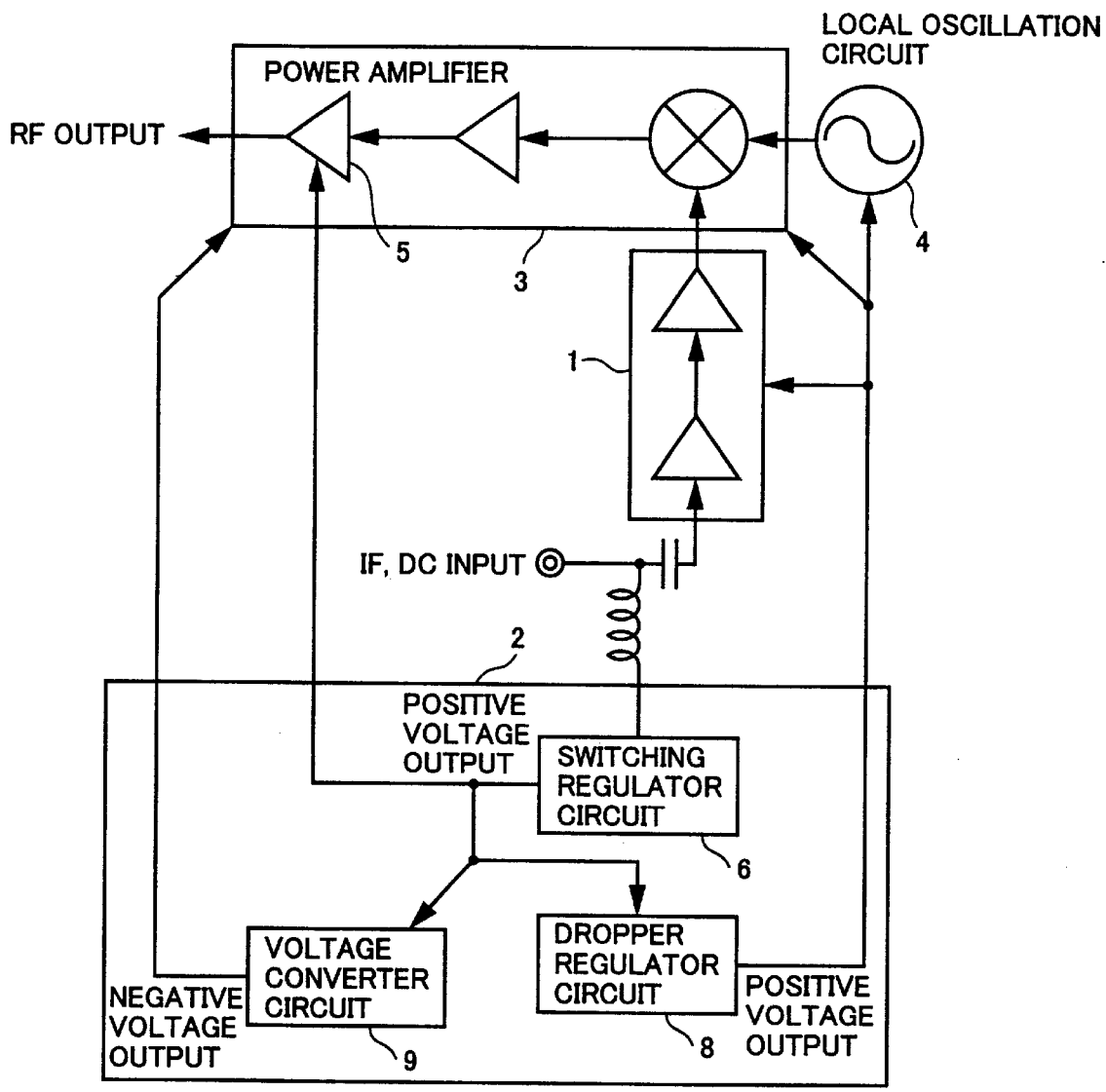
FIG. 1 shows a transmitter and a power supply circuit in accordance with one embodiment of the present invention.

FIG. 1 shows a transmitter and a power supply circuit in accordance with one embodiment of the present invention. Referring to FIG. 1, the IF signal input from an IF, DC input is appropriately amplified by IF circuit 1 and input to RF circuit 3, in the similar manner as in the prior art example.

The intermediate frequency signal is mixed in RF circuit 3 with the local oscillation signal input from local oscillation circuit 4, and has its frequency converted to a microwave signal having higher frequency than the intermediate frequency signal. The converted microwave signal is appropriately amplified by RF circuit 3, input to power amplifier 5 where it is further amplified to a high power signal, and transmitted.

The DC voltage input to power supply circuit 2 is input to switching regulator circuit 6. The output of switching regulator circuit 6 is directly supplied to power amplifier 5. For this purpose, such a type of switching regulator that provides the same voltage as the driving voltage of power amplifier 5 is used as switching regulator circuit 6. Alternatively, such a type of regulator may be used that can variably change the output voltage by an external circuit. Here, when the driving voltage is 10V, for example, the 10V voltage is supplied directly to power amplifier 5.

Conventionally, the 10V voltage is supplied from dropper regulator circuit 7. Therefore, the output of switching regulator circuit 6 had a voltage value naturally higher than 10V. When the voltage value is assumed to be 12V and the current consumption value of the power amplifier is assumed to be 1A, the improvement from the prior art example enables reduction in power consumption of (12−10)V×1A=2W. As the supply voltage lowers in another dropper regulator circuit 8 as well, the power consumption can further be decreased.

For further reduction of power consumption, power amplifier 5 may be replaced by one having smaller driving voltage, or dropper regulator circuit 8 may be replaced by a low input/output voltage regulator. It is necessary that the output voltage of switching regulator circuit 6 is the same as the driving voltage for power amplifier 5. There is a possibility, however, that the output voltage value of switching regulator circuit 6 cannot be lowered to the driving voltage of power amplifier 5, because of the output voltage value or specification of input/output voltages of dropper regulator circuit 8.

For example, when the output voltage of dropper regulator circuit 8 is 5V and the minimum voltage of input/output voltages is 2.5V, the output voltage of switching regular circuit 6 cannot be set to 7V, even when power amplifier 5 is replaced by one that can be driven at a low voltage of 7V. This is because the input voltage of dropper regulator circuit 8 can be reduced to the minimum of 5+2.5=7.5V. Here, when dropper regulator circuit 8 is replaced by a regulator of which input/output voltage is 1.5V, the minimum input voltage of 5+1.5=6.5V becomes possible, and therefore the output voltage of switching regulator circuit 6 can be set to 7V.

Figure 7:
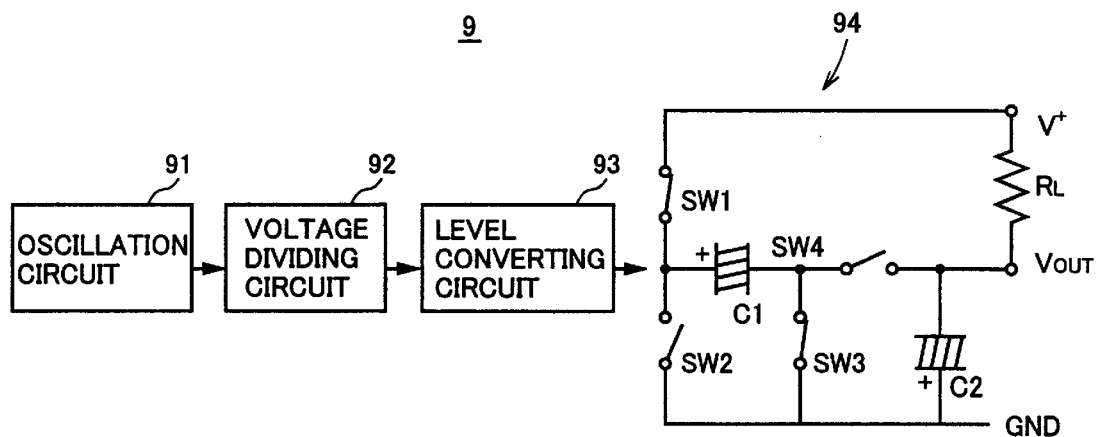
FIG. 7 shows a principal of operation of the charge cycle in a voltage converter circuit shown in FIG. 6.
Figure 8:
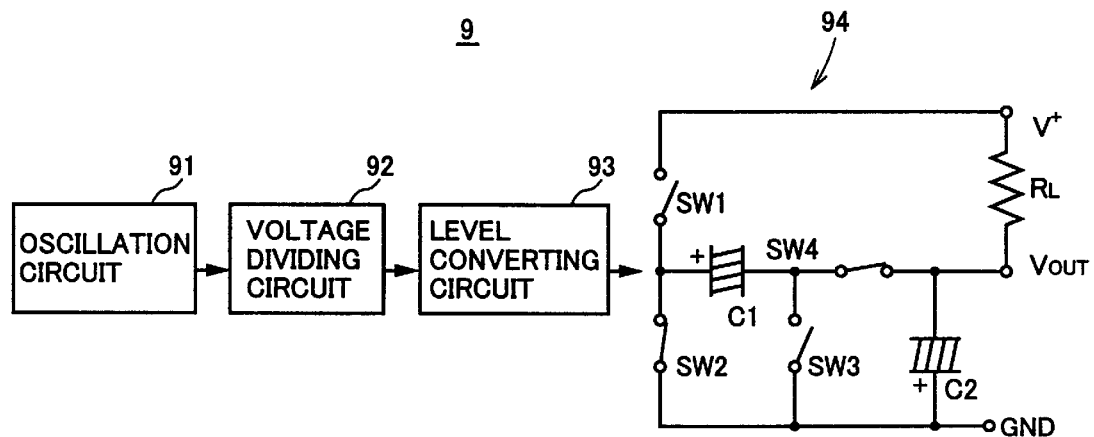
FIG. 8 shows a principal of operation of a pump cycle in the voltage converter circuit.

Voltage converter circuit 9 is a voltage inverting circuit providing a negative voltage, and it has such a characteristic in that the absolute value of the output voltage lowers as there is larger output voltage, as described with reference to FIGS. 7 and 8. Therefore, generally, for the output of voltage converter circuit 9, a negative voltage regulator is used. Therefore, similar to dropper regulator circuit 8, it is necessary to consider the input/output voltage characteristic of the negative voltage regulator. It is noted, however, that when the output current is large, the inverted negative voltage output becomes too low, making practical use difficult.

Figure 2:
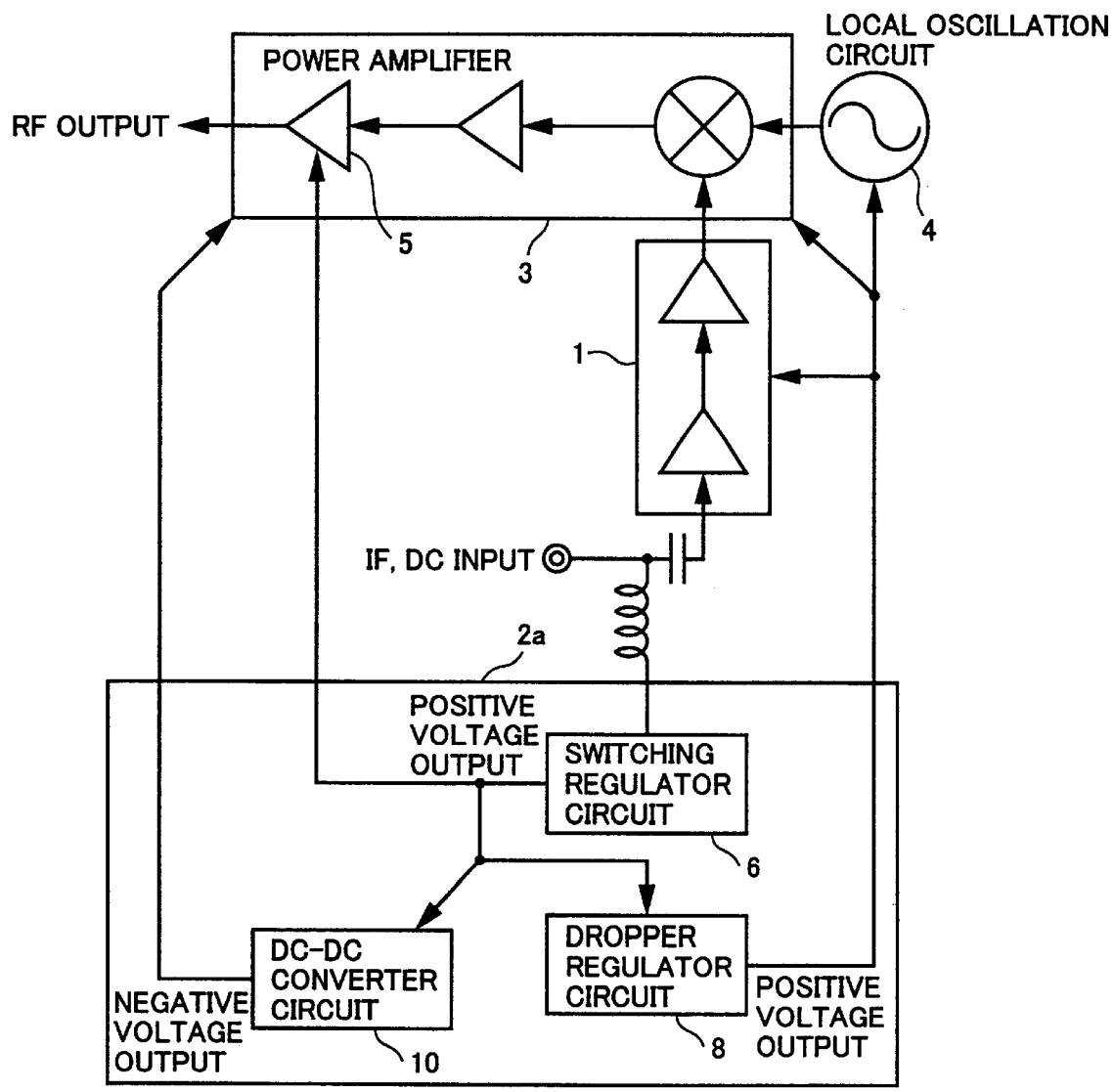
FIG. 2 shows a transmitter and a power supply circuit in accordance with another embodiment of the present invention.

FIG. 2 shows another embodiment of the present invention which solves the problem of lowering of the negative voltage output, by replacing voltage converter circuit 9 shown in FIG. 1 with a DC-DC converter circuit 10. The reason why DC-DC converter circuit 10 is used is that the absolute value of the output negative voltage does not lower even when the power consumption increases.

Figure 3:
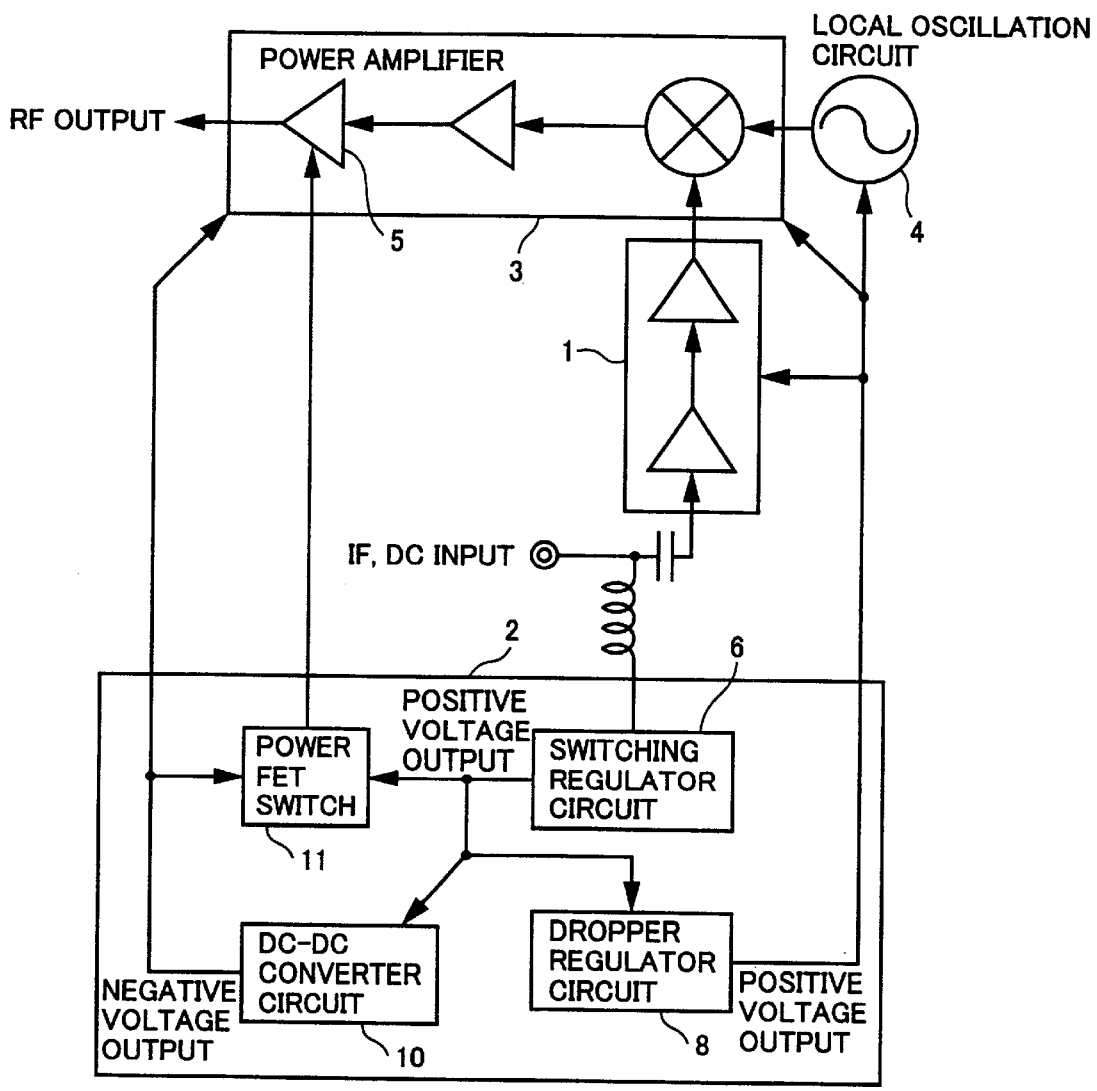
FIG. 3 shows a transmitter and a power supply circuit in accordance with a further embodiment of the present invention.

FIG. 3 shows a transmitter and a power supply circuit in accordance with a further embodiment of the present invention. In the embodiment shown in FIG. 3, a power FET switch 11 is inserted to the voltage supply line from switching regulator 6 to power amplifier 5. Dependent on the characteristic of power amplifier 5, it is possible that when a positive voltage is applied before application of a negative voltage to power amplifier 5, the positive voltage causes excessive current, resulting in destruction of power amplifier 5. In order to prevent such destruction, the power FET switch 11 is turned on to apply the positive voltage, only when there has been an application of the negative voltage.

This prevents self-destruction of power amplifier 5. When power FET switch 11 is on, a current flows through the FET, and therefore, dependent on the on resistance of the FET, there is generated a power loss. Recently, however, the on resistance of the FET has been remarkably reduced, and hence there is hardly a problem in power loss and heat generation. Alternatively, a power transistor may be used, if the switching speed allows.

Figure 4:
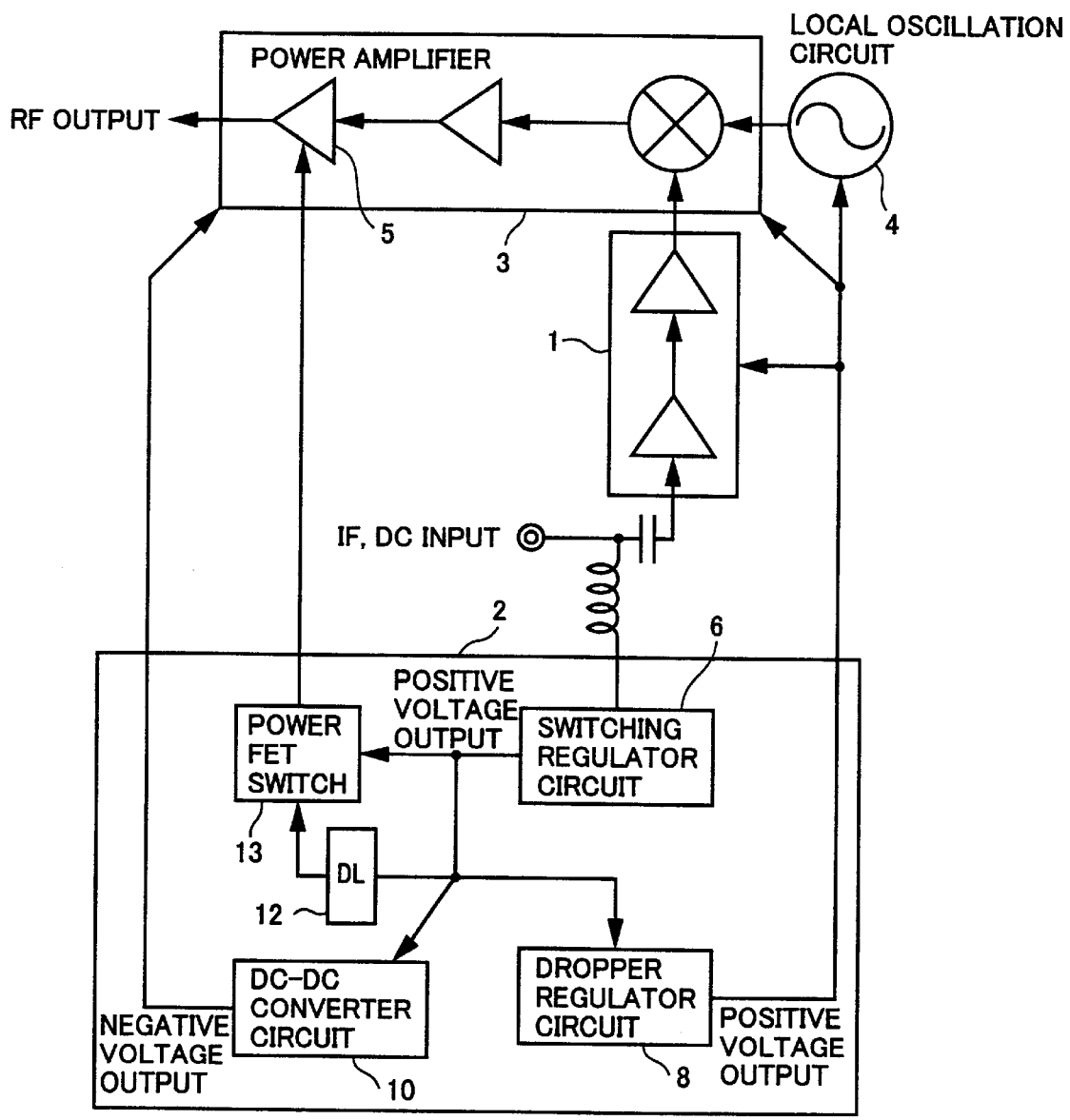
FIG. 4 shows a transmitter and a power supply circuit in accordance with a still further embodiment of the present invention.
Figure 5:
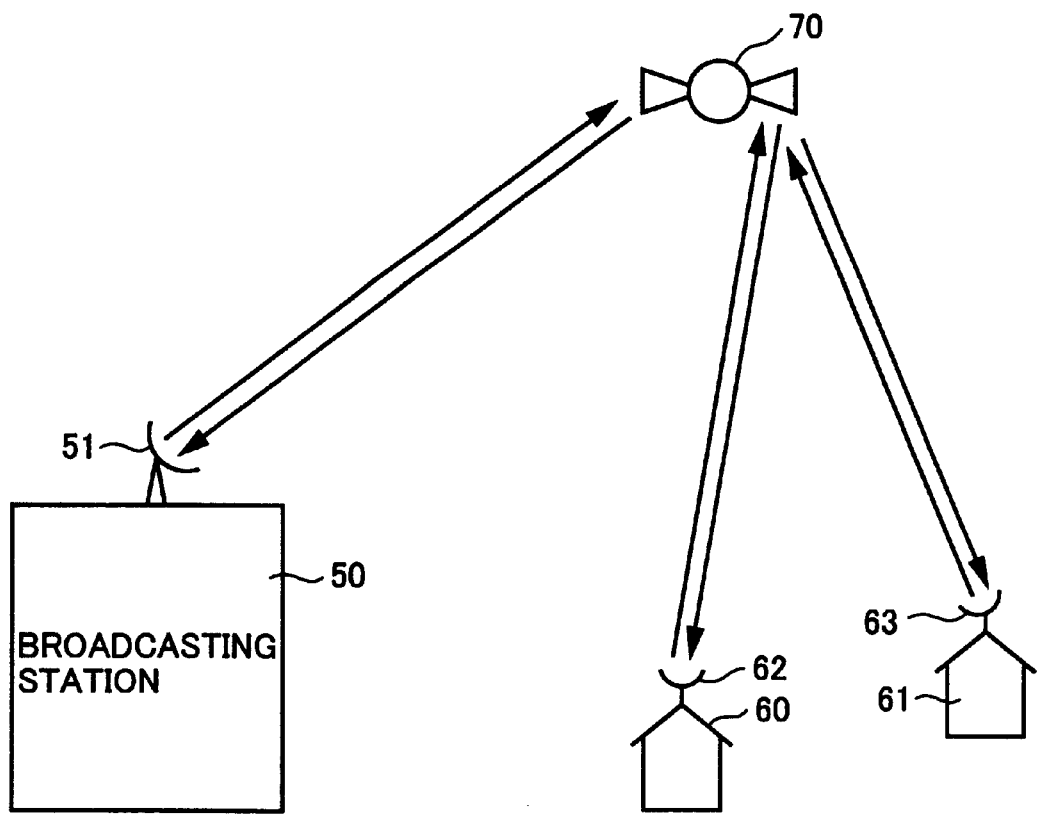
FIG. 5 is an illustration of a bi-directional communication between a broadcasting station and households through a broadcasting satellite.
Figure 6:
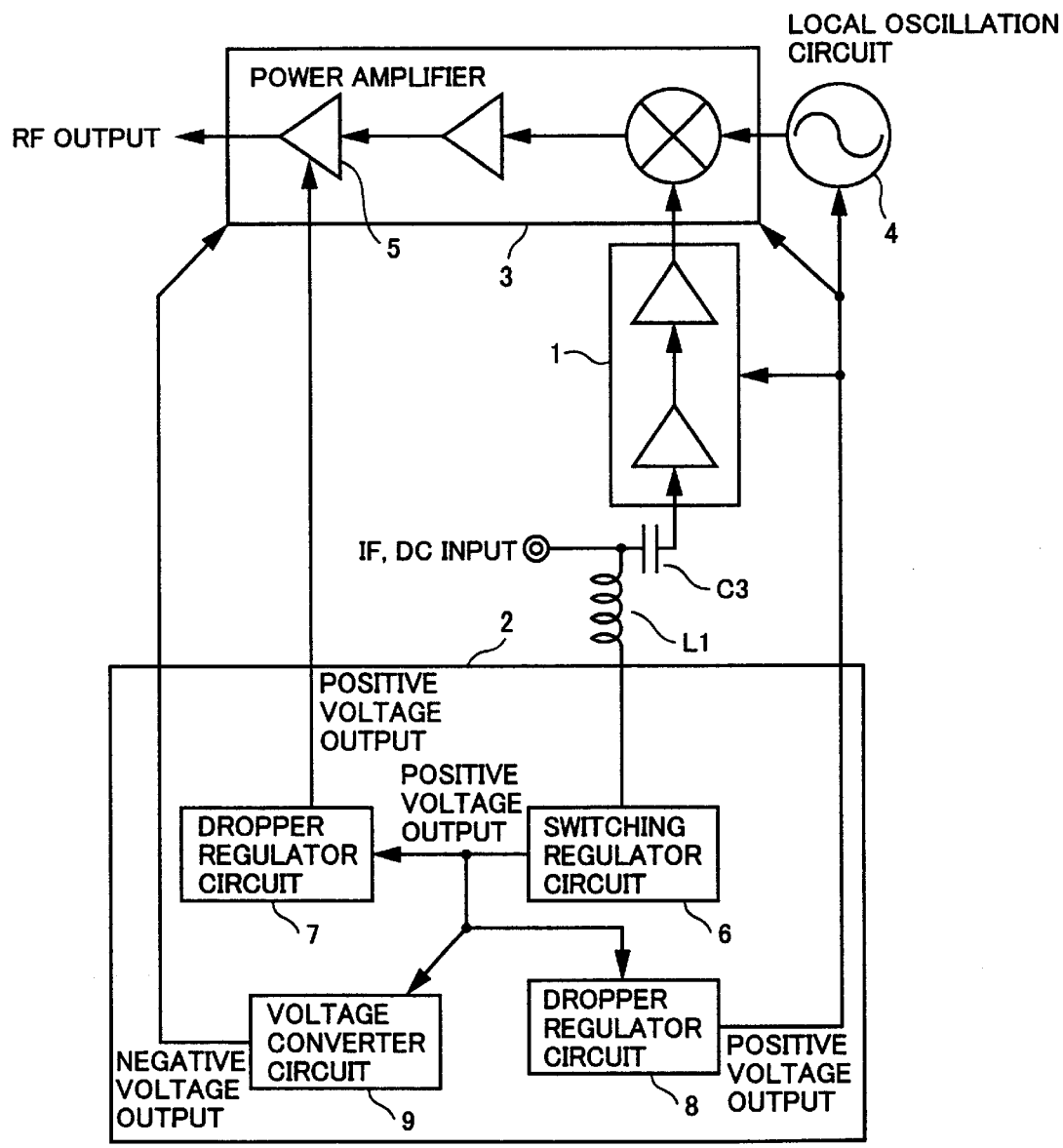
FIG. 6 shows a conventional transmitter and a conventional power supply circuit.

FIG. 4 shows a transmitter and a power supply circuit in accordance with a still further embodiment of the present invention. In the embodiment described with reference to FIG. 3 above, power FET switch 11 turns on only when a negative voltage is applied, so as to allow application of a positive voltage to power amplifier 5. In the embodiment shown in FIG. 4, the positive voltage from switching regulator circuit 6 is delayed by a prescribed time period by a delay circuit 12, and after the negative voltage from DC-DC converter circuit 10 is supplied to the voltage supply line to power amplifier 5, power FET switch 13 is turned on and the positive voltage from switching regulator 6 is supplied to power amplifier 5. Thus, similar to the embodiment shown in FIG. 3, self-destruction of power amplifier 5 can be prevented.

As described above, according to the embodiments of the present invention, a switching regulator circuit for converting an input DC voltage to a prescribed DC voltage, and a power amplifier for amplifying the microwave signal are provided, and the output DC voltage from switching regulator circuit is supplied directly to the power amplifier without any intervening regulator. Therefore, the loss corresponding to the voltage drop experienced in the dropper regulator in the prior art can be eliminated, so that the power consumption of the overall transmitter is reduced and the cost is reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A power supply circuit for a low power consumption transmitter that converts an intermediate frequency signal superposed on an input DC voltage to a microwave signal for output, said power supply circuit comprising:
    a switching regulator circuit converting said input DC voltage with said intermediate frequency signal superimposed thereon to a prescribed DC voltage; and
    a power amplifier amplifying said microwave signal; wherein
        the DC voltage as an output of said switching regulator circuit is supplied directly to said power amplifier without any intervening regulator.

2. The power supply circuit for a transmitter according to claim 1, wherein
    said switching regulator circuit includes a circuit for variably changing an output voltage.

3. The power supply circuit for a transmitter according to claim 1, further comprising
    a switching element connected between said switching regulator circuit and said power amplifier, for turning on/off supply of the DC voltage.

4. The power supply circuit for a transmitter according to claim 3, further comprising
    a voltage converting circuit converting a positive voltage to a negative voltage; wherein
        said switching element turns on/off the DC voltage to be supplied to said power amplifier, dependent on presence/absence of an output voltage of said voltage converting circuit.

5. The power supply circuit for a transmitter according to claim 4, wherein
    said voltage converting circuit converting a positive voltage to a negative voltage is a DC-DC converter.

6. The power supply circuit for a transmitter according to claim 3, further comprising
    a delay element delaying the DC voltage output from said switching regulator circuit; wherein
        said switching element turns on to supply the DC voltage from said switching regulator to said power amplifier, in response to a delayed output signal from said delay element.

7. The power supply circuit for a transmitter according to claim 1, wherein
said power amplifier is driven with a low voltage.

8. The power supply circuit for a transmitter according to claim 1, further comprising
a dropper regulator for converting the output voltage of said switching regulator to a voltage for driving another circuit.

9. The power supply circuit for a transmitter according to claim 8, wherein
said dropper regulator is a low input/output voltage regulator.

10. A power supply circuit for a low power consumption transmitter that converts an intermediate frequency signal superposed on an input DC voltage to a microwave signal for output, said power supply circuit comprising:
    a switching regulator circuit converting said input DC voltage with said intermediate frequency signal superimposed thereon to a prescribed DC voltage;
    a separating unit for separating the DC voltage from the intermediate frequency signal; and
    a power amplifier amplifying said microwave signal; wherein
        the DC voltage as an output of said switching regular circuit is supplied directly to said power amplifier without any intervening regulator.

11. A power supply circuit for a low power consumption transmitter that converts an intermediate frequency signal superposed on an input DC voltage to a microwave signal for output, said power supply circuit comprising:
    a switching regulator circuit converting said input DC voltage with said intermediate frequency signal superimposed thereon to a prescribed DC voltage;
    a coil for separating the DC voltage from the intermediate frequency signal; and
    a power amplifier amplifying said microwave signal; wherein
        the DC voltage as an output of said switching regulator circuit is supplied directly to said power amplifier without any intervening regulator.

* * * * *